(12) United States Patent
Jeddeloh

(10) Patent No.: US 7,925,949 B2
(45) Date of Patent: Apr. 12, 2011

(54) EMBEDDED PROCESSOR

(75) Inventor: Joe M. Jeddeloh, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 231 days.

(21) Appl. No.: 12/252,223

(22) Filed: Oct. 15, 2008

(65) Prior Publication Data

US 2010/0095168 A1 Apr. 15, 2010

(51) Int. Cl.
 *G01R 31/28* (2006.01)
(52) U.S. Cl. ......... 714/733; 714/710; 714/711; 714/25; 714/30; 714/48; 714/715; 714/718; 714/719; 714/720; 714/724; 714/726; 714/735; 714/738; 714/799; 365/200; 365/201; 702/117; 702/118
(58) Field of Classification Search .................. None
 See application file for complete search history.

(56) References Cited

U.S. PATENT DOCUMENTS

| | | | |
|---|---|---|---|
| 6,076,180 A * | 6/2000 | Meyer | 714/742 |
| 6,137,734 A * | 10/2000 | Schoner et al. | 365/194 |
| 6,182,257 B1 * | 1/2001 | Gillingham | 714/733 |
| 6,954,888 B2 * | 10/2005 | Rajski et al. | 714/739 |
| 7,558,993 B2 * | 7/2009 | Park et al. | 714/722 |
| 2003/0066003 A1 * | 4/2003 | Parvathala et al. | 714/738 |
| 2003/0074614 A1 * | 4/2003 | Dorsey | 714/724 |
| 2003/0101395 A1 * | 5/2003 | Man et al. | 714/726 |
| 2004/0193985 A1 * | 9/2004 | Bhora et al. | 714/733 |
| 2004/0230395 A1 * | 11/2004 | Basto | 702/117 |
| 2005/0034028 A1 * | 2/2005 | Son | 714/43 |
| 2005/0044457 A1 * | 2/2005 | Jeddeloh | 714/718 |
| 2006/0200720 A1 * | 9/2006 | Grimme et al. | 714/738 |
| 2006/0236185 A1 * | 10/2006 | Baker | 714/738 |
| 2009/0224388 A1 * | 9/2009 | Bernstein et al. | 257/686 |
| 2009/0265589 A2 * | 10/2009 | Pyeon | 714/715 |
| 2009/0307542 A1 * | 12/2009 | Roohparvar | 714/704 |
| 2010/0002819 A1 * | 1/2010 | Conner | 375/355 |

\* cited by examiner

*Primary Examiner* — John P Trimmings
(74) *Attorney, Agent, or Firm* — Schwegman, Lundberg & Woessner, P.A.

(57) ABSTRACT

Electronic apparatus, systems, and methods of operating and constructing the electronic apparatus and/or systems include an embedded processor disposed in a logic chip to direct, among other functions, self-testing of an electronic device structure in conjunction with a pattern buffer disposed in the logic chip, when the electronic device structure is coupled to the logic chip. Additional apparatus, systems, and methods are disclosed.

25 Claims, 6 Drawing Sheets

EMBEDDED PROCESSOR

BACKGROUND

The market for electronic apparatus and systems is driving industry to higher operating speeds for processors and enhanced capacity in the devices operating with such processors. Concurrent with enhanced functionality and capacity of these electronic devices is enhanced complexity and consumption of power. Consumption of power can lead to depletion of power supply resources, increased operational costs, and performance degradation associated with heating and other effects associated with current flows in the devices.

DETAILED DESCRIPTION

The following detailed description refers to the accompanying drawings that show, by way of illustration, various embodiments of the present invention. These embodiments are described in sufficient detail to enable those skilled in the art to practice these and other embodiments. Other embodiments may be utilized, and structural, logical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

Figure 1:
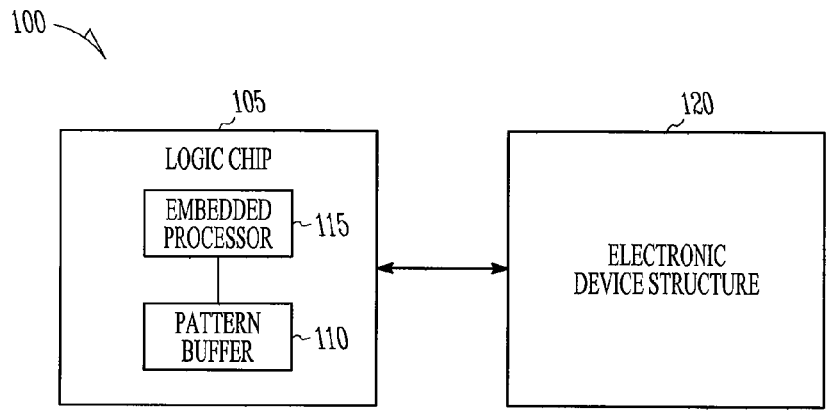
FIG. 1 shows a block diagram of an apparatus including a logic chip having a pattern buffer and an embedded processor, where the pattern buffer and the embedded processor are arranged to direct self-testing of an electronic device structure when coupled to the logic chip, according to various embodiments of the invention.

FIG. 1 shows a block diagram of an apparatus 100 including a logic chip 105 having a pattern buffer 110 and an embedded processor 115, where pattern buffer 110 and embedded processor 115 are arranged to direct self-testing of an electronic device structure 120 when coupled with logic chip 105, according to various embodiments. A logic chip is a die in which circuitry is formed such that the circuitry provides logic based functions. Pattern buffer 110, disposed in logic chip 105, may be constructed and operated as a plurality of pattern buffers.

Self-testing allows the combination of logic chip 105 and electronic device structure 120 to control testing of electronic device structure 120 in an autonomous fashion. The testing can be realized using pattern buffer 110 to provide a test pattern to electronic device structure 120, where the test pattern can be built into pattern buffer 110 by embedded processor 115. As the test pattern is processed by electronic device structure 120, embedded processor 115 can build another test pattern into pattern buffer 110. Logic chip 105 may be arranged to operatively stall pattern buffer 110 after output of the test pattern to electronic device structure 120 until another test pattern is built into pattern buffer 120 by embedded processor 115 such that a test of electronic device structure 120 includes patterns that are provided in a set of bursts such as to form a series of bursted patterns and stalls.

Logic chip 105 can be configured to manage operation of electronic device structure 120. Management of the operation of electronic device structure 120 may include testing and maintaining health of electronic device structure 120. The health of electronic device structure may be maintained by calibrating electronic device structure 120 and/or repairing electronic device structure 120. Repair of electronic device structure 120 may be realized by changing paths for signals from defective portions in electronic device structure 120 to other portions in electronic device structure 120 that are configured in electronic device structure 120 as spare components. Embedded processor 105 can be arranged to direct self-healing of electronic device structure 120 based on the self-testing of electronic device structure 120.

Electronic device structure 120 may be constructed as a plurality of devices, each device realized as an electronic chip. The electronic chips may be arranged in, but not limited to, a stack. With respect to a base, a stack is a vertical arrangement of components above the base, which may also be referred to as a vertical stack. These electronic chips may be interrelated to provide one or more functions for apparatus 100. Such electronic chips may include, but are not limited to, a number of application specific integrated circuits, a number of memory devices, a number of processing devices, a number of communication-related devices, or combinations thereof.

In various example embodiments, logic chip 105 may include a relatively small, efficient embedded processor 115 to provide high speed memory test for electronic device structure 120 configured as a stack of dynamic random access memories (DRAMs). Embedded processor 115 of logic chip 105 builds test patterns into pattern buffer 110. Pattern buffer 110 streams the test patterns to the DRAMs at interface speed. While the test patterns are being streamed to the DRAMS and processed by the DRAMs, embedded processor 115 builds the next pattern. Pattern buffer 110 stalls until embedded processor 115 has completed the generation task. The test is realized as a series of bursted patterns and stalls. This type of test process generates patterns faster then loading the patterns on a conventional JTAG (Joint Test Action Group) interface port and does not depend on external hardware arranged as a full blown algorithmic pattern generator (APG). Pattern buffer 110 can contain both an address buffer and a data buffer for testing individual locations in the DRAMs.

Optionally, a JTAG interface port may be used to program embedded processor 115. A static random access memory (SRAM) provided for program code store may be configured from buffers architected into logic chip 105. The JTAG interface port may also be arranged to provide access to pattern buffer 110 for manual programming of pattern buffer 110. Manual programming may be used with looping capabilities and arithmetic logic unit (ALU) functionality on the DRAM addresses, where the looping capabilities and the ALU functionality are configured in pattern buffer 110. The looping capabilities and the ALU functionality of pattern buffer 110 allows for patterns to be sent continuously from pattern buffer 110 without embedded processor intervention. Such a test process provides an optional, lower throughput test method.

Figure 2:
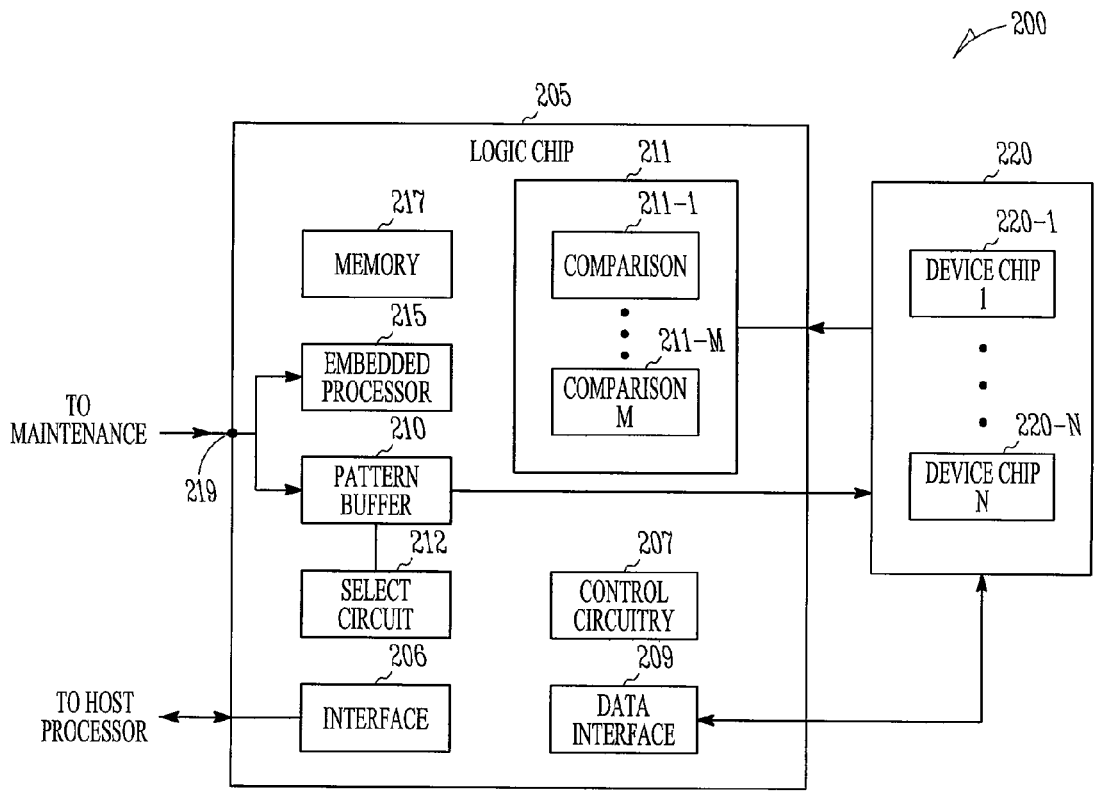
FIG. 2 shows a block diagram of an apparatus including a logic chip having a pattern buffer and an embedded processor, where the pattern buffer and the embedded processor are arranged to direct self-testing of an electronic device structure when coupled to the logic chip, according to various embodiments of the invention.

FIG. 2 shows a block diagram of an apparatus 200 including a logic chip 205 having a pattern buffer 210 and an embedded processor 215, where pattern buffer 210 and embedded processor 215 are arranged to direct self-testing of an electronic device structure 220 when coupled with logic chip 205, according to various embodiments. Logic chip 205, pattern buffer 210, an embedded processor 215, and electronic device structure 220 may be arranged to include performance of operations in a manner similar to, or identical to, apparatus 100 such as, but not limited to, self-healing and self-testing.

Logic chip 205 may include control circuitry 207 to manage electronic device structure 220, an interface 206 to couple logic chip 205 to a host processor, a data interface 209 to direct transmission of data to and from electronic device structure 220 in response to commands from the host processor, and a memory 217 to store instructions for embedded processor 215 to build one or more sets of test patterns into pattern buffer 210. Memory 217 may be arranged as buffers disposed in the logic chip. Each test pattern may be sent from pattern buffer 210 to electronic device structure 220 that, in response, provides a signal based on the test pattern to a comparison module 211 of logic chip 205. Comparison module 211 can compare a reference with the signal from the electronic device structure 220 to self-test electronic device structure 220.

With electronic device structure 220 structured as a plurality of device chips 220-1 . . . 220-N, one or more test patterns from pattern buffer 210 can be operated on by one or more device chips 220-1 . . . 220-N. Each of device chips 220-1 . . . 220-N may provide a signal to comparison module 211 that is compared to a specific reference for each device chip 220-1 . . . 220-N. Comparison module 211 may be configured as number of comparisons 211-1 . . . 211-M. In various embodiments, each comparison 211-1 . . . 211-M may correspond to a different one of device chips 220-1 . . . 220-N, such that M=N. In various embodiments, comparisons 211-1 . . . 211-M may be arranged to perform comparisons of a series of self-tests that are arranged in a hierarchical fashion beginning with the simplest test to broadly determine conductivity in electronic device structure 220 to verifying a function of a component in electronic device structure 220. Such hierarchical testing can be controlled from embedded processor 215 using instructions stored in memory 217.

In various embodiments, embedded processor 215 may be programmed via a maintenance interface port 219. Such programming can include storing the instructions in memory 217. Maintenance interface port 219 can be configured to be selectively coupled to pattern buffer 210 such that pattern buffer 210 is capable of direct programming externally from logic chip 205. Logic chip 205 may include a select circuit 212 to optionally generate continuous test patterns over a time period from pattern buffer 210 to electronic device structure 220 without interaction with embedded processor 215. Such operation allows logic chip 205 to test electronic device structure 220 in conjunction with an external testing device in addition to self-testing the logic chip 205—electronic device structure 220. Maintenance interface port 219 may be configured to be compatible as a JTAG interface port.

Control circuitry 207 may be used with pattern buffer 210 to perform testing of electronic device structure 220 without direct activity from embedded processor 215. This testing may include looping test patterns to electronic device structure 220 with results provided to comparison module 211, which can be optionally selected to run in the looping mode with the pattern buffer 210. Pattern buffer 210 may loop a bit through simple computations associated with electronic device structure 220. Various counters and/or buffers may be arranged in control circuitry 207 to operate with pattern buffer 210 to perform loop testing. A looping algorithm may be built by embedded processor 215 for the looping process in which embedded processor 215 is then removed from the loop testing. In additional, pattern buffer 210 can be arranged to optionally operate in conjunction with an APG through maintenance interface port 219 to test electronic device structure 220.

Apparatus 200 may be coupled with a host processor to perform a number of applications as part of a larger device or system. With an example arrangement, as illustrated in FIG. 2, logic chip 205 can manage operation of electronic device structure 220 such that a host processor is relieved of the direct interaction with electronic device structure 220. In addition, logic chip 205 may provide for self-healing of electronic device structure 220 using spare components of electronic device structure 220 based on self-testing. Logic chip 205 can maintain a record of spare resources that have been used for repair and spare resources that are available for repair. This record may be stored in memory 217.

Logic chip 205 may also store a repair algorithm that analyzes the available and the unavailable spare to provide a decision to repair a problem detected in self-testing. This algorithm can be implemented by embedded processor 215. The self-testing may be conducted during the manufacturing process in which logic chip 205 and electronic device structure 220 are coupled in apparatus 200 as part of a larger device or system, or as a single combined unit. Self-testing may be conducted with logic chip 205 and electronic device structure 220 coupled in apparatus 200 in an operating environment as part of a larger device or system, or as a single combined unit.

Logic chip 205 may be disposed in a stack with electronic device structure 220. Electronic device structure 220 may be disposed on logic chip 205. Alternatively, logic chip 205 may be disposed on electronic device structure 220. In various embodiments, logic chip 205 may be arranged as one or a number of interrelated chips that form a chip set. Logic chip 205 and one or more additional logic chips, where each additional logic chip includes a pattern buffer and embedded processor, may be arranged such that the pattern buffer and the embedded processor of each additional logic chip jointly operate with logic chip 205 to direct self-testing of electronic device structure 220 when electronic device structure 220 is coupled with logic chip 205 and the additional logic chips.

Figure 3:
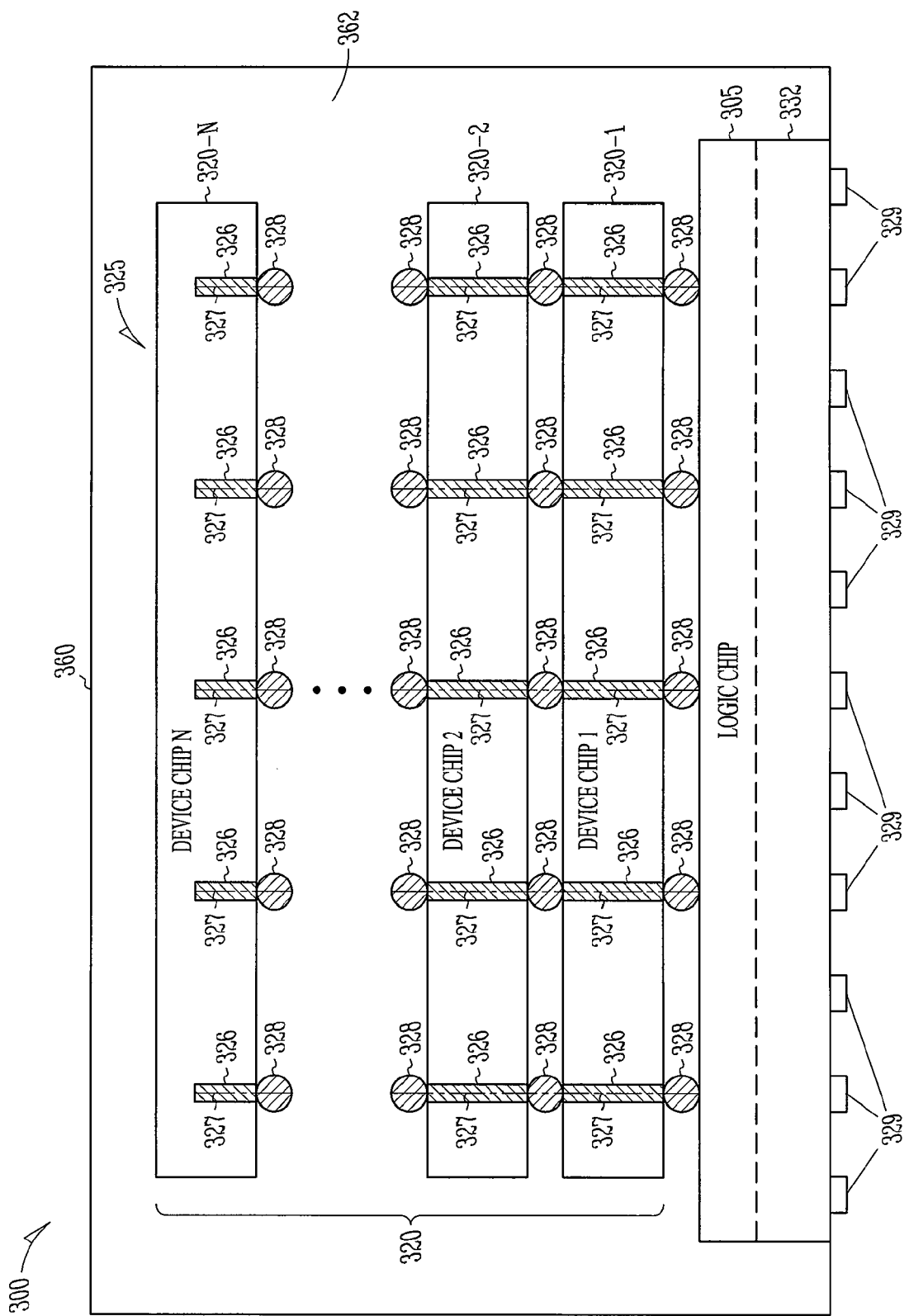
FIG. 3 illustrates an example of a three-dimensional integrated structure that can implement the combination, shown in FIGS. 1 and 2, according to various embodiments of the invention.

FIG. 3 illustrates an example of a three-dimensional (3-D) integrated structure that can implement the combination shown in FIGS. 1 and 2, of a logic chip and an electronic device structure, according to various embodiments. Logic chip 305 has a pattern buffer and an embedded processor, where the pattern buffer and the embedded processor are arranged to direct self-testing of electronic device structure 320 when coupled with logic chip 305. Electronic device structure 320 includes a number of device chips 320-1, 320-2 . . . 320-N arranged in a stack 325 disposed on logic chip 305. Device chips 320-1, 320-2 . . . 320-N may include, but are not limited to, a number of application specific integrated circuits, a number of memory devices, a number of processing devices, a number of communication-related devices, and combinations thereof. The pattern buffer and embedded processor of logic chip 305 are not shown in FIG. 3 in order to illustrate an example of a structural arrangement of a logic chip integrated with an electronic device structure, according to various embodiments.

Signal conductivity in stack 325 can be provided by through-substrate vias 326, containing conductive material 327, that essentially extend from one surface of the substrate of a chip to the opposite surface. In a silicon substrate or a silicon-based substrate, these through-substrate vias are referred to as through-silicon vias. Through-substrate vias 326 of one device chip may be communicatively coupled to through-substrate vias 326 of another device chip using conductive joints 328 formed pair-wise between device chips 320-1, 320-2 . . . 320-N. Joints 328 may include solder, copper, or a conductive adhesive. Joints 328 may also be used to contact electronic device structure 320 to logic chip 305. Stack 325 may be formed using techniques such as "flip-chip" or other techniques. With the 3-D integration realized as a number of device chips disposed on a logic chip forming a stack, through-substrate vias interconnect the device chips and the logic chip in the z-direction. Thousands or more of these through-substrate vias 326 allow implementation of transmission paths that can be implemented with these device chips 320-1, 320-2 . . . 320-N and logic chip with equivalent transmission capabilities as if arranged on the same horizontal plane. Through-substrate vias 326, containing conductive material 327, can be arranged to provide, depending on the application of such a 3-D integration, various combinations of data buses, address buses, control lines, and other communication paths.

Stack 325 can be constructed in an IC package 300 including contacts 329 that provide the electrical conductivity to couple logic chip 305 and electronic device structure 320 to other application specific devices such as, but not limited, to host processors, maintenance apparatus, input/output devices, communication interfaces, various system buses, and other system components. Contacts 329 may provide for direct coupling to other application specific devices or for coupling to other application specific devices by system buses. Contacts 329 may be connected to a support 332 on which logic chip 305 may be disposed, with communication to logic chip 305 provided by through-substrate vias in support 332 or by other communication paths. Support 332 may include a semiconductor package substrate, a ceramic package substrate, an organic package substrate, or other package substrate appropriate for the configuration of stack 325.

In addition to contacts 329 for interfacing with external applications, IC package 300 may include an enclosure 360 having an interior 362 between the components of stack 325 and enclosure 360. Interior 362 may be filled with a filling material, a gas, a liquid, or a combination thereof. The filling material may include a polymer material.

In various embodiments, logic chip 305 may be formed on top of electronic device structure 320. In such an inverted orientation relative to FIG. 3, contacts 329 can be formed coupled to logic chip 305 to provide communication with system and/or system devices external to IC package 300. With the components of IC package arranged in a bonded fashion as illustrated and discussed above with filling material used in interior 362 of enclosure 360, IC package is not limited to mounting in a particular orientation. Other configurations for coupling electronic device structure 320 and logic chip 305 may be realized such that logic chip 305 is not limited to being arranged in stack 325 with electronic device structure 320.

Figure 4:
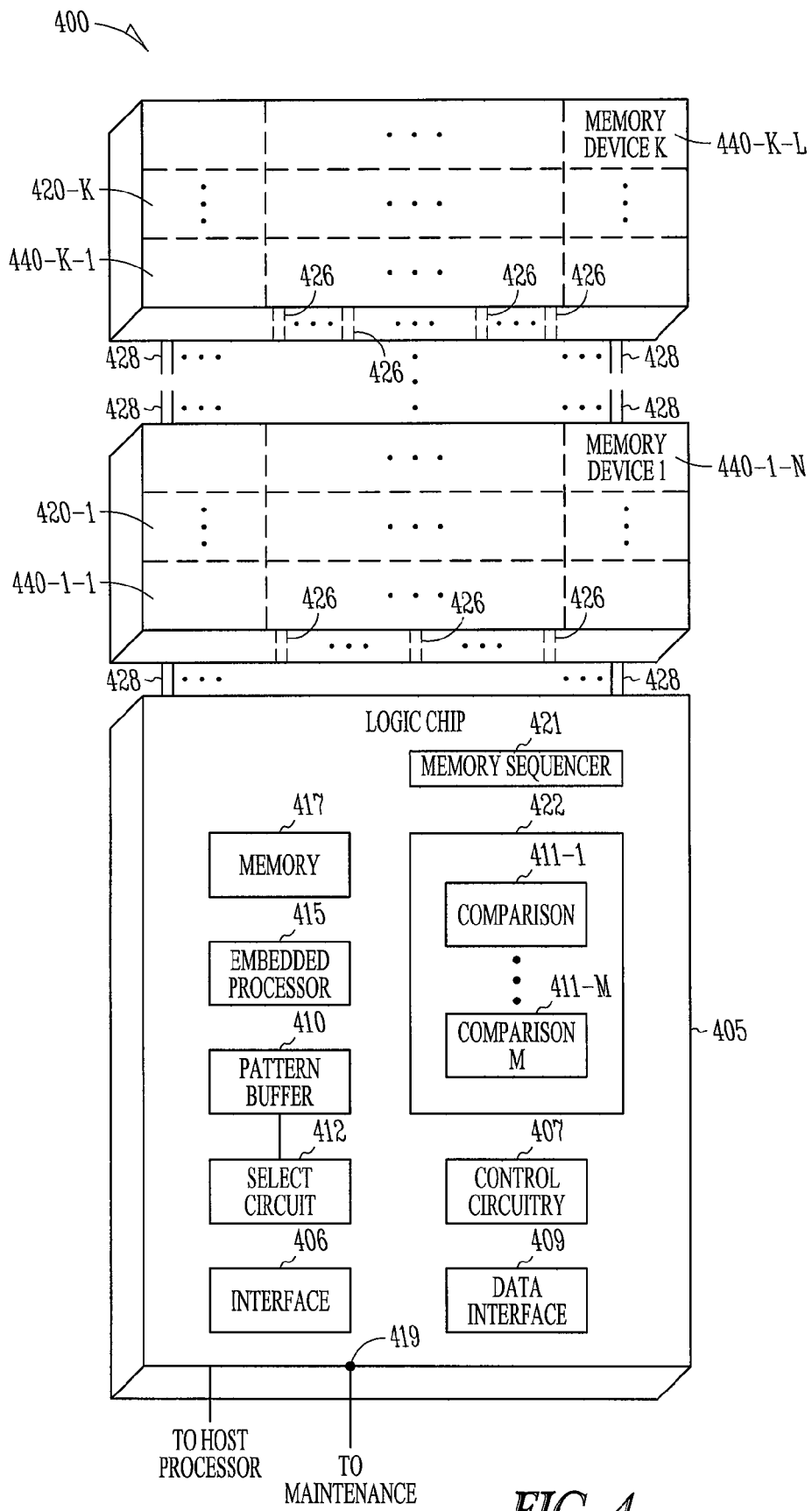
FIG. 4 shows an apparatus including a logic chip coupled to a stack of memory devices, according to various embodiments of the invention.

FIG. 4 shows an apparatus including a stack 420 of memory devices 420-1 . . . 420-K and a logic chip 405 coupled to stack 420, according to various embodiments. Logic chip 405 can be configured to manage the operation of stack 420 of memory devices 420-1 . . . 420-K. Logic chip 405 includes a pattern buffer 410 and an embedded processor 415, both disposed in logic chip 405, where pattern buffer 410 and embedded processor 415 are arranged to direct self-testing of stack 420 and its components when coupled with logic chip 405. Embedded processor 405 can be configured to build a test pattern into the pattern buffer 410. Pattern buffer 410 may be constructed and operated as a plurality of pattern buffers.

Memory systems may be designed to operate with a multi-core processor as a host processor. A multi-core processor has a number of cores in which each core has a computing element and a router that provides for processing data individually and for transporting that data to neighboring cores. With multi-core processors, having 80, 100, or 200 cores, spatial considerations and bandwidth considerations for a memory system increase the impact of memory system design. Indeed, memory data transport capability may influence ultimate system processing efficiency more than microprocessor clock rates.

Stack 420 of memory devices 420-1 . . . 420-K can be located beside a host processor with logic chip 405 underneath stack 420 of memory devices 420-1 . . . 420-K, where logic chip 405 interfaces to memory devices 420-1 . . . 420-K, accesses data from stack 405, and translates the accessed data to a high speed interconnect. The translation to the high speed interconnect to transmit the accessed data to a host processor can be conducted in a logic process that is more suited for high speed interfacing to the host processor than is currently used in conventional memory-processor configurations. In addition, with logic chip 405 configured to manage operation of stack 420 of memory devices 420-1 . . . 420-K, the host processor can be relieved of such management tasks.

Logic chip 405 may include control circuitry 407 to manage stack 420, an interface 406 to couple logic chip 405 to a host processor, a data interface 409 to direct transmission of data to and from stack 420 in response to commands from the host processor, and circuitry, which may be implemented in control circuitry 407, to operatively stall pattern buffer 410 after output of the test pattern to stack 420. The stall can be maintained until another test pattern is built into pattern buffer 410 by embedded processor 415 such that a test of stack 420 of memory devices 420-1 . . . 420-K includes a series of bursted patterns and stalls. Logic chip 405 can include memory 417 to store instructions executable by the embedded processor arranged to direct self-healing of stack 420 of memory devices 420-1 . . . 420-K based on the self-testing of stack 420. Logic chip 405 can include a memory sequencer 421 to direct transmission of data to and from the stack of memory devices in response to commands from a host processor. Embedded processor 415 may be programmed via such a host processor.

In various embodiments, embedded processor 415 may be programmed via a maintenance interface port 419. Such programming can include storing the instructions in memory 417. Maintenance interface port 419 can be configured to be selectively coupled to pattern buffer 410 such that pattern buffer 410 is capable of directly controlled programming externally from logic chip 405. Logic chip 405 may include a select circuit 412 to operatively generate continuous test patterns over a time period from pattern buffer 410 to electronic device structure 420 without interaction with embedded processor 415. Such operation allows logic chip 405 to test stack 420 in conjunction with an external testing device in addition to self-testing of the logic chip 405—stack 420 arrangement. Maintenance interface port 419 may be configured to be compatible as a JTAG interface port.

With tasks directed to self-testing and/or self-healing, embedded processor 415 can be configured with respect to these tasks such that it may be arranged as a small efficient processor. In an embodiment, embedded processor 415 may be structured having 50,000 to 100,000 gates. Embedded processor 415 may be constructed with less gates or more gates. With embedded processor 415 and pattern buffer 410 operating to self-test stack 420 in which the pattern generation can be started, stopped, and analyzed, running the memory devices of stack 420 at a high rate for long periods of time may be avoided. Embedded processor 415 can be arranged to conduct self-testing of stack 420 based on algorithmic control, which may be complex, to create test patterns that are loaded in pattern buffer 410. The output of the tests patterns from pattern buffer 410 can be started and stopped at sufficient speeds to provide detailed testing of stack 420.

With local memory 417 including code as a set of instructions for embedded processor 415 to generate patterns, hardware on logic chip 405 can parallelize the patterns allowing a single copy of a pattern to be pushed out as multiple different copies to memory devices 420-1 . . . 420-K of stack 420. All of memory devices 420-1 . . . 420-K can be driven at the same time with the data providing test results checked and embedded processor 415 monitoring the process. In an embodiment, 16 DRAM devices may be tested in this parallelized manner. Other memories and number of memory devices may be arranged in stack 420 and tested in this parallelized manner. Use of logic chip 405 with its embedded processor 415 allows parallelized testing without operating at memory interface speeds associated with conventional external testers to test memory devices in a parallelized fashion. This testing may provide reduced testing expense with respect to conventional external testers configured to test memory devices in a parallelized fashion.

Apparatus 400 may be coupled with a host processor to perform a number of applications as part of a larger device or system. In an example arrangement, as illustrated in FIG. 4, logic chip 405 can manage operation of stack 420 such that a host processor is relieved of the direct interaction with stack 420. In addition, logic chip 405 may provide for self-healing of stack 420 using spare components of stack 420 based on self-testing. The self-testing may be conducted during the manufacturing process in which logic chip 405 and stack 420 are coupled together in apparatus 400 as part of a larger device or system, or as a single combined unit. The self-testing may be conducted with the logic chip 405 and stack 420 coupled in apparatus 400 in an operating environment as part of a larger device or system, or as a single combined unit.

Memory 417 can be loaded with various data and algorithms at various times, including the boot time of logic chip 405—electronic device structure 420 in an apparatus. The various different algorithms may be performed autonomously by logic chip 405. Logic chip 405 may also store a repair algorithm that analyzes the available and unavailable spare elements to provide a decision to repair a problem detected in self-testing to initiate self-healing of stack 420. Self-testing may be conducted during the manufacturing process in which logic chip 405 and stack 420 are coupled in apparatus 400 as part of a larger device or system, or as a single combined unit. Self-testing may be conducted with the logic chip 405 and stack 420 coupled in apparatus 400 in an operating environment as part of a larger device or system, or as a single combined unit. Various algorithms can be implemented by embedded processor 415. Embedded processor 415 may be also be viewed as maintenance processor in logic chip 405 that is a health monitor in addition to being a maintenance processor to manage the testing and the health of stack 420.

Logic chip 405 and stack 420 may be coupled in a manner similar to or identical to that illustrated with respect to FIG. 3. Signal conductivity in stack 420 can be provided by through-substrate vias 426, containing conductive material, that essentially extend from one surface of the substrate of a chip to the opposite surface. Through-substrate vias 426 of one memory device may be communicatively coupled to through-substrate vias 426 of another memory device chip using conductive joints 428 formed pair-wise between memory devices 420-1, 420-2 . . . 420-K. Joints 428 may include solder, copper, or a conductive adhesive. Joints 428 may also be used to connect stack 420 to logic chip 405. Stack 420 may be formed using techniques such as "flip-chip" or other techniques. With the 3-D integration realized as a number of memory devices disposed on a logic chip forming a stack, through-substrate vias interconnect the memory devices and the logic chip in the z-direction. Thousands or more of these through-substrate vias 426 allow implementation of transmission paths that can be implemented with these device chips 420-1, 420-2 . . . 420-K and logic chip with equivalent transmission capabilities as if arranged on the same horizontal plane. Through-substrate vias 426, containing conductive material, can be arranged to provide, depending on the application of such a 3-D integration, various combinations of data buses, address buses, control lines, and other communication paths.

In various embodiments, stack 405 of memory devices 420-1, 420-2 . . . 420-K can be arranged as a plurality of horizontal levels in the vertical stack such that each memory at a horizontal level is partitioned on each horizontal level. Each of memory devices 420-1, 420-2 . . . and 420-K can be arranged as a plurality of logical partitions, a plurality of physical partitions in a single memory device, a plurality of memory devices with a different memory device for each partition, or combinations. In these partitions, each physical memory device may be configured as a single independent chip. Partitions 440-1-1 . . . 440-1-N of memory device 420-1 may be different in number from the number of partitions in one or more of the other memory devices 420-2 . . . 420-K. For example, memory device 420-K may have partitions 440-K-1 . . . 440-K-L, where L is an integer different from N. Alternatively, L may equal N. In embodiment, L may equal N such that the number of partitions is the same for all memory devices 420-1 . . . 420-K.

Logic device 405 can communicate with memory devices 440-1-1 . . . 440-1-N . . . 440-K-1 . . . 440-K-L concurrently, providing management of these devices and monitoring of the health of these devices. In various embodiments, stack 420 may be constructed with K=N=4 arranged as 4 horizontal levels with each level having 4 memory devices such that logic device 405 can communicate with these 16 memory devices concurrently. In various embodiments, concurrent management of the memory devices and monitoring of the health of these memory devices in stack 405 can be realized for K and N having values other than K=N=4.

Logic chip 405 can provide memory management of data flow for stack 420 of parallelized memory devices, such as DRAM memory devices, using memory sequencer 421 and separating stack 420 from a high speed link. Signal conductivity in stack 420 realized by through-substrate vias 426 coupled to logic chip 405 provides data pipes for the data flow to and from parallelized memory devices of stack 420. Logic chip 405 creates an interconnect infrastructure to connect through-substrate vias 426 with the memory devices in stack 420, whether in a partitioned arrangement or without such partitioning. The interconnect infrastructure may be arranged as a switching fabric.

With the management of data flow separated from the high speed link, stack 420 is independent of changes to the high speed link and interface changes of processors coupled to the high speed link. Such independence of stack 420 from the high speed link allows stack 420 to be used with different high speed links as speeds increase to 10 gigabytes per second, 20 gigabytes per second, and higher. In addition, control of stack 420 can be separated from a host processor to which stack 420 may be coupled to perform functions of applications in systems in which the host processor and stack 420 are inserted. Though a host processor directs flow of information in the system in which the host processor and stack 420, logic chip 405 is arranged to manage data flow to and from stack 420 as requested by the host processor. In addition to the control of data flow to and from stack 420, the separation of stack 420 from conventional management from a host processor, as taught herein, allows logic chip 405 to manage the health of stack 420. Such health management can include calibration and repair of one or more components of stack 420.

Embedded processor 415 and pattern buffer 410 can be configured to perform testing, including self-testing, of stack 420 in a number of different ways. Embedded processor 415 and pattern buffer 410 can be arranged to test memory devices 420-2 . . . 420-K at each horizontal level based on the horizontal level. Embedded processor 415 and pattern buffer 410 can be arranged to test memory devices 420-2 . . . 420-K at a partition. Embedded processor 415 and pattern buffer 410 can be arranged to test memory devices 420-2 . . . 420-K at a partition on each horizontal level in conjunction with the other partitions on the same horizontal level.

Embedded processor 415 and pattern buffer 410 can be arranged to test memory devices 420-2 . . . 420-K at a partition on a horizontal level in conjunction with corresponding partitions on other horizontal levels based on the same relative partition. For example, a test may be conducted for the set of partitions, 440-$i$-$j$ with i including 1-K and j being a fixed integer. Embedded processor 415 and pattern buffer 410 can be arranged to test memory devices 420-2 . . . 420-K at a partition on a horizontal level in conjunction with the corresponding partitions arranged as a vertical slice through the stack of memory devices 420-2 . . . 420-K. In an example, memory devices 420-2 . . . 420-K may be arranged with 16 XY partitions on a horizontal level for each vertical level (Z value) such that the set of XY partitions at each Z value form 16 different vertical slices. Each vertical slice, which may be referred to as a vault, can be tested independent of the other vaults. Though they may be tested independently, these 16 vaults may be tested in a parallel manner from logic chip 405. Stack 420 is not limited to 16 vaults. The number of vaults of stack 420 may be greater than or less than 16. A vault arrangement may be constructed for other electronic device structures such as those discussed with respect to FIGS. 1-3 and 5-9.

Control of the sequencing of the test of stack 410 can be managed by embedded processor 415. Alternatively, control of the sequencing of the test of stack 410 can be managed by embedded processor 415 in conjunction with memory sequencer 421 and/or control circuitry 407. Memory sequencer 421 and/or control circuitry 407 can also manage the storage and retrieval of data from the memory locations distributed in memory devices 420-2 . . . 420-K. Sequencing instructions may also be stored in memory 417.

Figure 5:
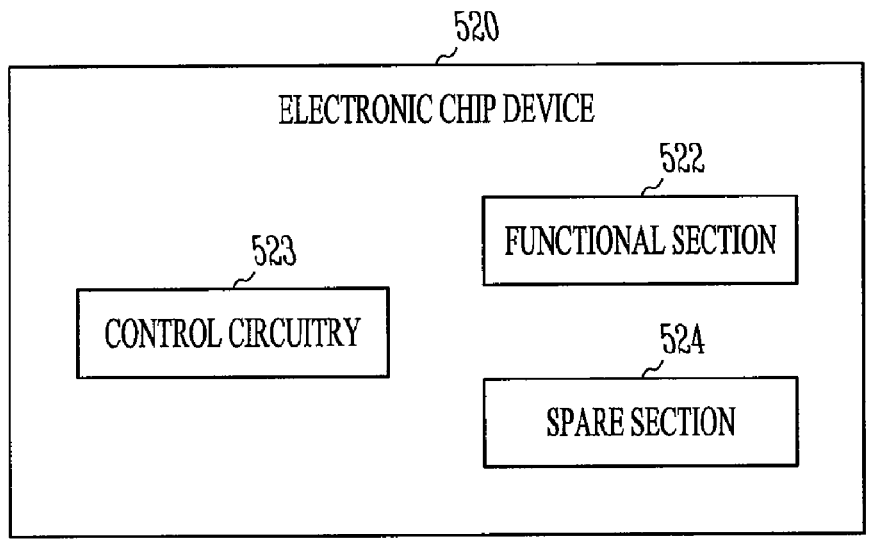
FIG. 5 shows a representation of an electronic device chip having a functional section and a spare section, according to various embodiments of the invention.

FIG. 5 shows a representation of an electronic device chip 520 having a functional section 522 and a spare section 524, according to various embodiments. Electronic device chip 520 may be implemented in electronic device structure 120, as a device chip 220-$i$ (i=1, 2, . . . or N) in electronic device structure 220, as a device chip 320-$j$ (j=1, 2, . . . or N) in electronic device structure 320, as a memory device 420-$p$ (p=1, 2, . . . or K) in stack 420, or as a chip in a similar arrangement as taught herein. Activation of a portion of spare section 524 for substitution of a portion of functional section 522 can be controlled by a logic chip arranged in a manner similar or identical to the arrangements illustrated with respect to FIGS. 1-4. In various embodiments, control circuitry 523 may be used to aid in substituting a portion of spare section 524 for a portion of functional section 522.

For total redundancy, spare section 524 may be arranged as a complete copy of functional section 522. The substitution of a portion of spare section 524 for a portion of functional section 522 can be conducted as part of a self-healing process initiated after a self-test controlled by a logic chip arranged in a manner similar or identical to the arrangements taught with respect to FIGS. 1-4.

Figure 6:
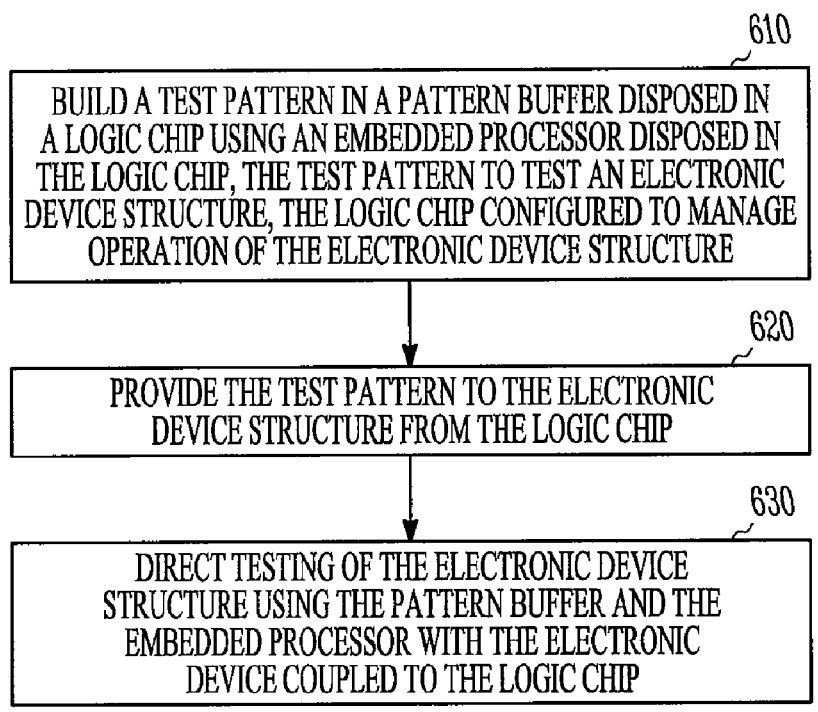
FIG. 6 illustrates features of a method to test an electronic device structure using a pattern buffer and an embedded processor, both disposed in a logic chip, according to various embodiments of the invention.

FIG. 6 illustrates features of a method to test an electronic device structure using a pattern buffer and an embedded processor, both disposed in the logic chip, according to various embodiments. At 610, a test pattern is built in a pattern buffer disposed in a logic chip using an embedded processor disposed in the logic chip, where the test pattern is provided to test an electronic device structure. The logic chip can be configured to manage operation of the electronic device structure. Various embodiments of a logic chip with an embedded processor and pattern buffer, as disclosed herein, may be used in such methods (e.g. see FIGS. 2 and 4).

At 620, the test pattern is provided to the electronic device structure from the logic chip. The test pattern may be sent to the electronic device structure disposed above the logic chip using through-substrate vias in the electronic device structure.

At 630, testing of the electronic device structure is directed using the pattern buffer and the embedded processor with the electronic device structure coupled to the logic chip. In various embodiments, testing of the electronic device structure includes self-testing directed by the embedded processor and the pattern buffer with the electronic device structure coupled to the logic chip. The pattern buffer can be stalled after output of the test pattern to the electronic device structure until another test pattern is built into the pattern buffer by the embedded processor such that a test of the electronic device structure includes a series of bursted patterns and stalls.

A memory in the logic chip may be programmed with instructions executable by the embedded processor to manage health features of the electronic device structure. Based on the self-testing of the electronic device structure, self-healing of the electronic device structure may be directed using instructions in the logic chip. Directing the self-healing of the electronic device structure may include repairing the electronic device structure. In addition to self-testing, tests of the electron device structure may be inserted into the logic chip using the pattern buffer and a device external to the logic chip without interaction with the embedded processor.

Directing the self-testing of the electronic device structure may include sequentially performing a set of self-tests arranged on a hierarchical basis. First, a starting point may include the premise that there are no errors in the electronic device structure such that testing of the multiple devices in the electronic device structure can be performed in parallel at a relatively fast pace using simple tests, such as continuity testing, that can be conducted with parallel resources of the logic chip. A next set of tests can increase the testing complexity directed to sets of circuits. These more complex tests can include test patterns to the electronic device structure that provide responses to comparison modules 211, 411, or other comparison modules configured to operate according to the teachings of the various embodiments herein.

The embedded processor of the logic chip can be arranged to examine the results of the comparisons. The embedded processor can monitor flags to determine mis-comparisons. Based on the mis-comparisons, additional algorithms stored in the logic device can be executed by the embedded processor to analyze the failure and initiate repair algorithms.

The logic chip may include multiple levels of programs that would be implemented by embedded processor to work through problems determined by testing. As the testing complexity increases, error detection may change from parallel processing to focusing down on specific errors with additional tests or algorithms relative to the function of the section of a particular device in the electronic device structure where the error has been identified as being located. The logic chip may be arranged to automatically work to the next level of functionality within the electronic device structure without any intervention other than from the programs stored in the logic chip and the embedded processor to execute the programs.

Figure 7:
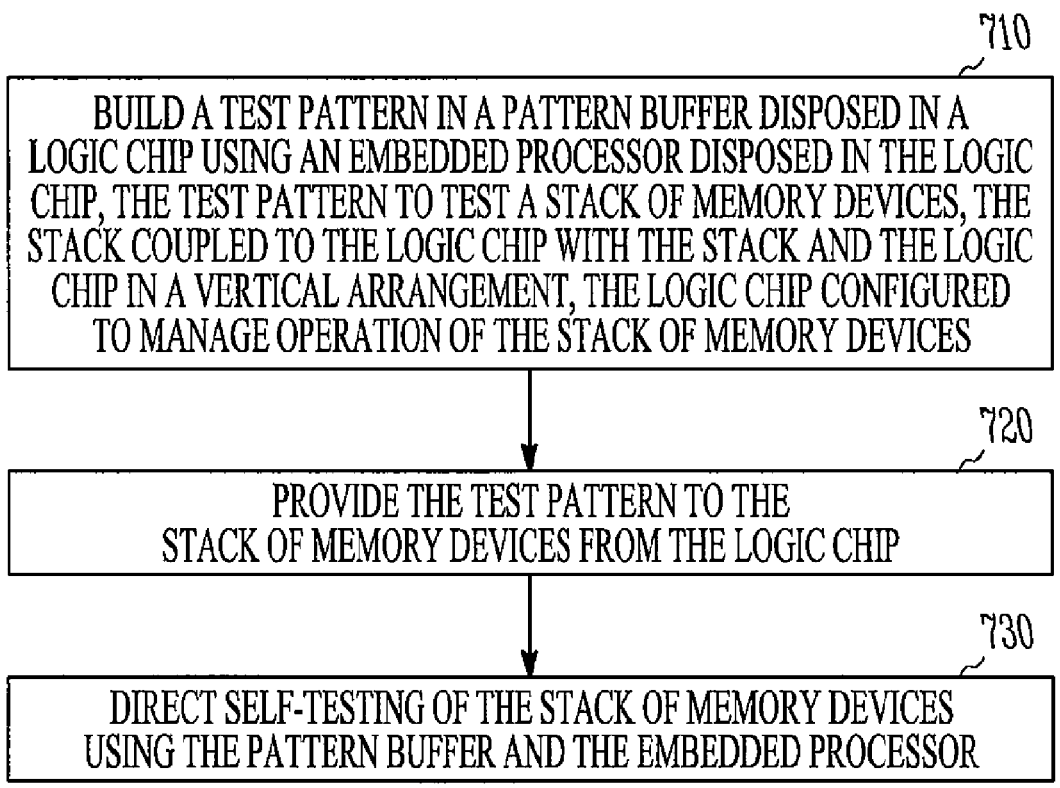
FIG. 7 illustrates features of a method to test a stack of memory devices, in a vertical arrangement with a logic chip, using a pattern buffer and an embedded processor, both disposed in the logic chip, according to various embodiments of the invention.

FIG. 7 illustrates features of a method to test a stack of memory devices, in a vertical arrangement with a logic chip, using a pattern buffer and an embedded processor, both disposed in the logic chip, according to various embodiments. At 710, a test pattern is built in a pattern buffer disposed in a logic chip using an embedded processor disposed in the logic chip, where the test pattern is provided to test a stack of memory devices with the stack coupled to the logic chip in a vertical arrangement. The logic chip may be configured to manage operation of the stack of memory devices. Various embodiments of a logic chip with an embedded processor and pattern buffer, as disclosed herein such as illustrated with FIG. 4 for example, may be used in such methods.

At 720, the test pattern is provided to the stack of memory devices from the logic chip. At 730, self-testing of the stack of memory devices is directed using the pattern buffer and the embedded processor. The pattern buffer can be stalled after output of the test pattern to the stack of memory devices until another test pattern is built into the pattern buffer by the embedded processor such that a test of the stack of memory devices includes a series of bursted patterns and stalls.

Based on the self-testing of the electronic device structure, self-healing of the stack of memory devices may be directed from the logic chip. Directing the self-healing of the stack of memory devices may include repairing a section of the stack of memory devices. Directing the self-healing of the stack of memory devices may include calibrating a portion of the stack of memory devices.

Directing the self-testing of the stack of memory devices may include sequentially performing a set of self-tests arranged on a hierarchical basis. An initial test may include a test of the stack of memory devices, using the embedded processor arrangement in a logic chip according to various embodiments, to determine electrical continuity of the memory devices in the stack. A canned set of patterns may be used for continuity testing. A canned set of patterns is a set of patterns that can be applied to a number of different devices. The canned patterns can be used for various types of devices in a stack forming an electronic device structure such that the canned set of patterns is not limited to a stack of memory devices.

Testing can proceed to testing at a horizontal level, which may be partitioned into testing the devices in the stack independently in different directions, such as sending a pattern along an x-direction and sending a pattern along a y-direction. Testing may include sending a pattern in a partitioned z-direction, where the z-direction is along the vertical of the stack. In addition, the test patterns can be generated to create tests of interactions of adjunct devices in the stack. Various permutations and combinations of devices in the stack can be tested using different sets of test patterns.

Testing can include testing the infrastructure that couples the devices together, such as the infrastructure for operating memory cells in a stack of DRAMs. Testing memory devices in the stack can include testing the rows and columns of a memory and the circuitry that exercises these rows and columns. In addition to testing infrastructure for devices in a stack, the interfacing to the stack from the logic device and from the logic device to a system bus can be checked. In a non-limiting example, timing to DRAM devices in a stack can be tested. Data eye tests can be generated in which a clock frequency is changed and setup and hold conditions are checked. Test patterns may be processed that generate data eyes to check the setup and hold conditions with respect to neighboring devices and adjacent device interconnections on an interface in order to determine operating margins on the interface. With control of self-testing by the logic chip with its embedded processor, different tests for different features of the stacked device and its infrastructure can be conducted. The embedded processor can be arranged as the master of the self-testing to run different algorithms and to test different sections of the stacked device.

Self-testing of the stack of memory devices may be organized with the stack arranged as a plurality of horizontal levels such that each horizontal level includes a partition of memory devices. The partition of memory devices may be a logical partition of a single physical memory chip. The partition of memory devices may be a partition of a multiple memory chips arranged on a horizontal level of the stack of memory chips. Self-testing of the stack of memory devices with the stack arranged as a plurality of horizontal levels may include testing each horizontal level based on the horizontal level. Self-testing the stack of memory devices with the stack arranged as a plurality of horizontal levels may include testing at a partition on each horizontal level in conjunction with corresponding partitions on other horizontal levels based on the partition. Testing at a partition on each horizontal level may include testing relative to a vertical slice through the stack of memory devices.

Testing using a logic chip having an embedded processor and pattern buffer, according to arrangements associated with FIGS. 1-9, can be conducted in a manufacturing mode and in an operational mode. During manufacturing test, the results of self-testing can be used to conduct repair to an electronic device structure coupled to the logic chip. After completing the manufacture of the electronic device structure coupled to the logic chip and operating in an apparatus or system, self-testing by the logic chip-electronic device structure combination can be performed to determine if one or more portions of the electronic device structure are functioning properly. Based on the self-test information, self-healing of the devices in the electronic device structure can be conducted. The logic chip can be arranged with control features to determine the health of the electronic device structure and with algorithms to step though a series of choices to initiate the self-healing. Such self-healing can be realized by using spare resources in the electronic device structure to make repairs. Such spare resources may be additional circuits within individual electronic device chips or one or more individual electronic device chips configured in the electronic device structure to provide sets of spare elements. In addition, during the operational lifetime to the electronic device structure, the tests directed by the embedded processor of the logic chip can be changed by programming additional tests into a memory on the logic chip. Further, additional tests can be conducted externally from the logic chip-electronic device structure combination using inputs to the logic chip.

In various embodiments, structures having a logic chip and an electronic device structure arranged to conduct self-testing of the electronic device structure, when coupled to the logic chip, may be formed in other apparatus and may be formed as part of a system. The structures can use a pattern buffer and an embedded processor, both disposed in the logic chip, to conduct the self-testing. The electronic device structure may be arranged to include a stack of memory chips. Conventional techniques for forming the individual memory chips may be implemented in forming the electronic device structure, as described herein.

Figure 8:
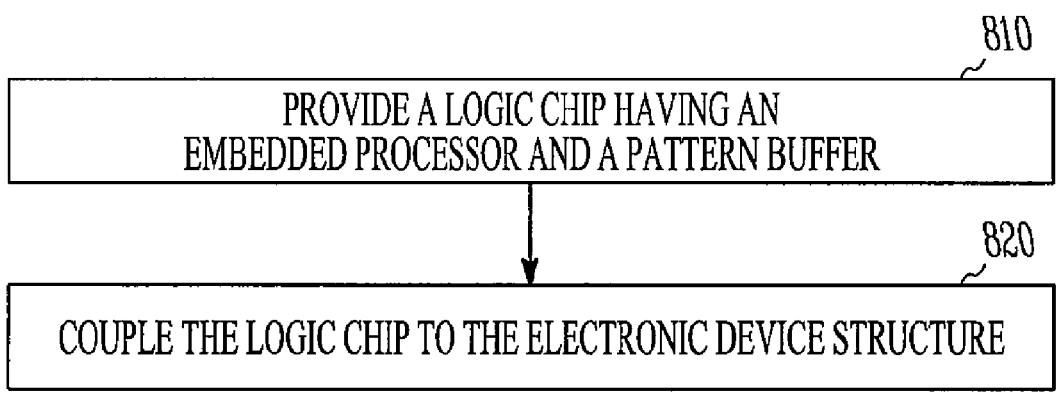
FIG. 8 illustrates features of a method that includes forming an apparatus having a logic chip and an electronic device structure arranged to conduct self-testing of the electronic device structure, when coupled to the logic chip, using a pattern buffer and an embedded processor both disposed in the logic chip, according to various embodiments of the invention.

FIG. 8 illustrates features of a method that includes forming an apparatus having a logic chip and an electronic device structure arranged to conduct self-testing of the electronic device structure, when coupled to the logic chip, using a pattern buffer and an embedded processor both disposed in the logic chip, according to various embodiments of the invention. At 810, a logic chip having an embedded processor and a pattern buffer are provided. The logic chip may be formed using conventional techniques to form electronic devices and circuits on chips. An embedded processor may be formed in the logic chip and configured with the pattern buffer to direct self-testing of an electronic structure to which the logic chip is coupled.

At 820, the logic chip is coupled to the electronic device structure. The coupled combination of logic chip and electronic device structure may be coupled to one or more components of a system. The construction of the system may include, but is not limited to, forming fiber optic systems or devices, forming electro-optic systems or devices, forming optical systems or devices, forming imaging systems or devices, and forming information handling systems or devices such as wireless systems or devices, telecommunication systems or devices, and computers.

Figure 9:
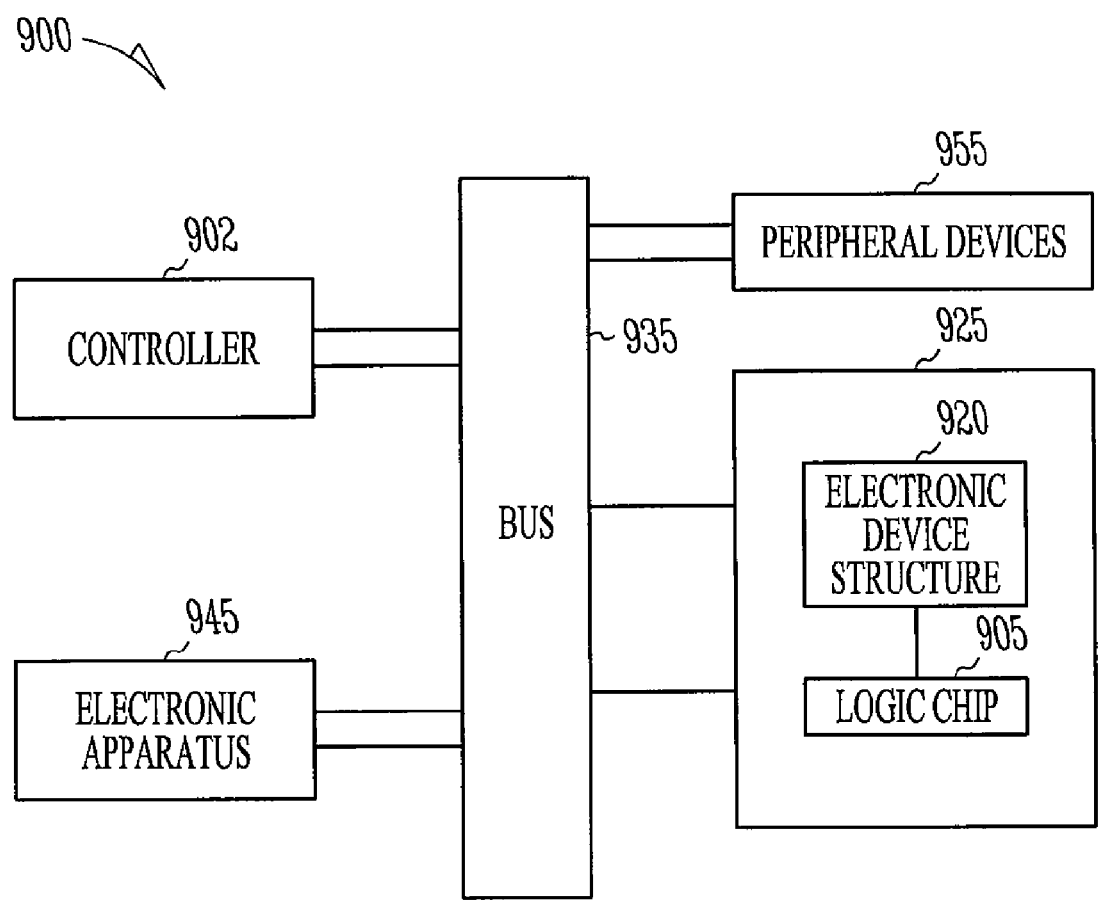
FIG. 9 shows a block diagram of various features of an electronic system, according to various embodiments of the invention.

FIG. 9 shows a block diagram of various features of an electronic system 900, according to various embodiments of the invention. System 900 can include a controller 902 an apparatus 925 having a logic chip 905 coupled with an electronic device structure 920. System 900 may be formed in various ways such as coupling the individual components of system 900 together or integrating the components into one or a number of units using conventional techniques. In an embodiment, system 900 also includes an electronic apparatus 945 and a bus 935, where bus 935 provides electrical conductivity between controller 902 and electronic apparatus 945 and between controller 902 and apparatus 925. In an embodiment, bus 935 includes an address bus, a data bus, and a control bus, each independently configured. In an alternative embodiment, bus 935 uses common conductive lines for providing one or more of address, data, or control, the use of which is regulated by controller 902. In an embodiment, electronic apparatus 945 may include memory for the intended functional applications of electronic system 900.

Apparatus 925 having a logic chip 905 coupled with an electronic device structure 920 may be realized in accordance with various embodiments, some of which are illustrated in FIGS. 1-8. Logic chip 905 includes an embedded processor and pattern buffer to provide self-testing of electronic device structure. Electronic device structure 920 may be structured as a plurality of devices, each device realized as an electronic chip. The electronic chips may be arranged in a stack. These electronic chips may be interrelated to provide one or more functions for apparatus 900. Such electronic chips may include, but are not limited to, a number of application specific integrated circuits, a number of memory devices, a number of processing devices, a number of communication-related devices, or combinations thereof.

With electronic device structure 920 arranged as a stack of memory device, the memory device chips may include, but are not limited to, dynamic random access memory, static random access memory, synchronous dynamic random access memory (SDRAM), synchronous graphics random access memory (SGRAM), double data rate dynamic ram (DDR), and double data rate SDRAM, arranged in various embodiments as taught herein. Structures of various embodiments of apparatus 925 having a logic chip 905 coupled with an electronic device structure 920, in accordance with various embodiments as illustrated in FIGS. 1-8, may be realized in simulation packages that may be arranged as software, hardware, or a combination of software and hardware packages to simulate various embodiments and/or the operation of various embodiments.

In various embodiments, peripheral device or devices 955 are coupled to bus 935. Peripheral devices 955 may include displays, imaging devices, printing devices, wireless devices, wireless interfaces (e.g. wireless transceivers), additional storage memory, control devices that may operate in conjunction with controller 902. In an embodiment, controller 902 includes a processor. In various embodiments, system 900 includes, but is not limited to, fiber optic systems or devices, electro-optic systems or devices, optical systems or devices, imaging systems or devices, and information handling systems or devices such as wireless systems or devices, telecommunication systems or devices, and computers. Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Thus, the following claims are hereby incorporated into the Detailed Description, with each claim standing on its own as a separate embodiment.

What is claimed is:

1. An apparatus comprising:
a logic chip to manage operation of an electronic device structure, the logic chip structured to couple directly to the electronic device structure such that all data flow to and from the electronic device structure is conducted through and controlled by the logic chip;
a pattern buffer disposed in the logic chip arranged to provide a test pattern to the electronic device structure; and
an embedded processor disposed in the logic chip, the processor configured to build the test pattern into the pattern buffer, the pattern buffer and the embedded processor arranged to direct testing of the electronic device structure when coupled to the logic chip.

2. The apparatus of claim 1, wherein the logic chip comprises circuitry to operatively stall the pattern buffer after output of the test pattern to the electronic device structure until another test pattern is built into the pattern buffer by the embedded processor such that a test of the electronic device structure includes a series of bursted patterns and stalls.

3. The apparatus of claim 1, wherein the embedded processor is arranged to direct self-testing of the electronic device structure and to direct self-healing of the electronic device structure, the self-healing based on the self-testing of the electronic device structure.

4. The apparatus of claim 1, wherein the logic chip comprises a comparison module to compare a reference with a signal from the electronic device structure, the signal based on the test pattern.

5. The apparatus of claim 1, wherein the logic chip comprises a select circuit to operatively generate continuous test patterns over a time period from the pattern buffer to the electronic device structure without interaction with the embedded processor.

6. The apparatus of claim 1, wherein the apparatus consists essentially of the logic chip and one or more additional logic chips, each additional logic chip including a pattern buffer and embedded processor, the pattern buffer and the embedded processor of each additional logic chip arranged to jointly operate to the logic chip to direct self-testing of the electronic device structure when the electronic device structure is coupled to the logic chip and the additional logic chips.

7. An apparatus comprising:
a logic chip to manage operation of an electronic device structure;
a pattern buffer disposed in the logic chip arranged to provide a test pattern to the electronic device structure; and
an embedded processor disposed in the logic chip, the processor configured to build the test pattern into the pattern buffer, the pattern buffer and the embedded processor arranged to direct testing of the electronic device structure when coupled to the logic chip, wherein the logic chip comprises a maintenance interface port operatively coupled to the embedded processor such that the embedded processor is programmable via the maintenance interface port, or operatively coupled to the pattern buffer such that the pattern buffer is capable of direct programming externally from the logic chip, or both operatively coupled to the embedded processor such that the embedded processor is programmable via the maintenance interface port and operatively coupled to the pattern buffer such that the pattern buffer is capable of direct programming externally from the logic chip.

8. An apparatus comprising:
a logic chip to manage operation of an electronic device structure;
a pattern buffer disposed in the logic chip arranged to provide a test pattern to the electronic device structure; and
an embedded processor disposed in the logic chip, the processor configured to build the test pattern into the pattern buffer, the pattern buffer and the embedded processor arranged to direct testing of the electronic device structure when coupled to the logic chip, wherein the electronic device structure is disposed above the logic chip in a stack.

9. An apparatus comprising:
a stack of memory devices; and
a logic chip directly coupled to the stack of memory devices such that the logic chip is configured in a vertical arrangement with the stack of memory devices, the logic chip to manage operation of the stack of memory devices, the logic chip including:
a pattern buffer disposed in the logic chip arranged to provide a test pattern to the stack of memory devices; and
an embedded processor disposed in the logic chip, the processor configured to build the test pattern into the pattern buffer, the pattern buffer and the embedded processor arranged to direct self-testing of the stack of memory devices.

10. The apparatus of claim 9, wherein the logic chip includes a memory sequencer to parallelize test patterns allowing a single copy of a test pattern to be pushed out in parallel to the memory devices.

11. The apparatus of claim 9, wherein the logic chip comprises memory to store instructions executable by the embedded processor arranged to direct self-healing of the stack of memory devices based on the self-testing of the stack of memory devices.

12. The apparatus of claim 9, wherein the stack of memory devices comprises memory arranged on a plurality of horizontal levels of the stack of memory devices, each memory partitioned on each horizontal level.

13. The apparatus of claim 12, wherein memory partitioned on each horizontal level comprises a plurality of separate memory devices on each horizontal level.

14. The apparatus of claim 12, wherein the embedded processor and the pattern buffer are arranged to test the memory at each horizontal level based on the horizontal level.

15. The apparatus of claim 12, wherein the embedded processor and the pattern buffer are arranged to test at a partition on each horizontal level in conjunction with corresponding partitions on other horizontal levels based on the partition.

16. An apparatus comprising:
a stack of memory devices, the stack including spare elements; and
a logic chip coupled to the stack of memory devices, the logic chip to manage operation of the stack of memory devices, the logic chip including:
a pattern buffer disposed in the logic chip arranged to provide a test pattern to the stack of memory devices;
an embedded processor disposed in the logic chip, the processor configured to build the test pattern into the pattern buffer, the pattern buffer and the embedded processor arranged to direct testing of the stack of memory devices;

a comparison unit to compare a reference with the signal from a memory device in the stack and provide the comparison result to the embedded processor; and a memory to store algorithms executable by the processor to analyze the comparison result to determine whether a failure in the stack has occurred.

17. The apparatus of claim 16, wherein the embedded processor is arranged to execute multiple levels of programs to analyze errors determined in testing and to initiate repair algorithms to activate one or more of the spare elements upon determining that a failure occurred.

18. The apparatus of claim 16, wherein the embedded processor is arranged to monitor flags to determine mis-comparisons.

19. A method comprising:
building a test pattern in a pattern buffer disposed in a logic chip using an embedded processor disposed in the logic chip;
applying the test pattern to a stack of electronic devices from the logic chip to perform self-testing of the stack such that the logic chip is configured in a vertical arrangement with the stack of memory devices; and
controlling the self-testing using the embedded processor to run a plurality of different algorithms and to test different sections of the stack.

20. The method of claim 19, wherein controlling the self-testing to test different sections of the stack includes controlling the self-testing to test different sections of an electronic device at a horizontal level of the stack.

21. The method of claim 19, wherein the method includes analyzing available and unavailable spare resources in the stack to provide a decision to repair a problem detected in self-testing.

22. A method comprising:
building a test pattern in a pattern buffer disposed in a logic chip using an embedded processor disposed in the logic chip, the test pattern to test an electronic device structure, the logic chip configured to manage operation of the electronic device structure;
providing the test pattern to the electronic device structure from the logic chip; and
directing testing of the electronic device structure using the pattern buffer and the embedded processor with the electronic device directly coupled to the logic chip such that all data flow to and from the electronic device structure is conducted through and controlled by the logic chip.

23. The method of claim 22, wherein the method further comprises stalling the pattern buffer after output of the test pattern to the electronic device structure until another test pattern is built into the pattern buffer by the embedded processor such that a test of the electronic device structure includes a series of bursted patterns and stalls.

24. The method of claim 22, wherein the method further comprises directing self-testing of the electronic device structure and directing self-healing of the electronic device structure, the self-healing of the electronic device structure based on the self-testing of the electronic device structure.

25. A method comprising:
building a test pattern in a pattern buffer disposed in a logic chip using an embedded processor disposed in the logic chip, the test pattern to test an electronic device structure, the logic chip configured to manage operation of the electronic device structure;
providing the test pattern to the electronic device structure from the logic chip; and
directing testing of the electronic device structure using the pattern buffer and the embedded processor with the electronic device coupled to the logic chip, wherein directing testing of the electronic device structure comprises directing testing of a stack of memory devices including sequentially performing a set of tests arranged on a hierarchical basis.

* * * * *